(12) United States Patent
Brownjohn et al.

(10) Patent No.: US 10,826,210 B2
(45) Date of Patent: Nov. 3, 2020

(54) BASE MODULE AND AVIATION COMPUTER SYSTEM HAVING THE BASE MODULE

(71) Applicant: Airbus Operations GmbH, Hamburg (DE)

(72) Inventors: Nicholas Brownjohn, Buxtehude (DE); Stefan Osternack, Hamburg (DE)

(73) Assignee: Airbus Operations GmbH, Hamburg (DE)

(*) Notice: Subject to any disclaimer, the term of this patent is extended or adjusted under 35 U.S.C. 154(b) by 136 days.

(21) Appl. No.: 15/809,554

(22) Filed: Nov. 10, 2017

(65) Prior Publication Data

US 2018/0131110 A1   May 10, 2018

(30) Foreign Application Priority Data

Nov. 10, 2016   (DE) .................... 10 2016 121 598

(51) Int. Cl.
*H01R 12/70*   (2011.01)
*H05K 1/14*   (2006.01)
(Continued)

(52) U.S. Cl.
CPC ......... *H01R 12/7076* (2013.01); *G06F 1/184* (2013.01); *H01R 12/716* (2013.01);
(Continued)

(58) Field of Classification Search
CPC .............. H01R 12/7076; H01R 12/716; H01R 2201/26; H01R 12/7088; H05K 1/141;
(Continued)

(56) References Cited

U.S. PATENT DOCUMENTS 6,801,769 B1 * 10/2004 Royalty ................. B64D 47/00
455/431
8,035,985 B2 * 10/2011 Nemoz ................ H05K 7/1449
361/797
(Continued)

OTHER PUBLICATIONS

"American National Standard for FPGA Mezzanine Card (FMC) Standard," VMEbus International Trade Association, VITA, version ANSI/VISTA 57.1-2008, pp. 1-78, dated 2008.
(Continued)

*Primary Examiner* — Nathan Milakovich
(74) *Attorney, Agent, or Firm* — Jenkins, Wilson, Taylor & Hunt, P.A.

(57) ABSTRACT

A base module and an aviation computer system having the base module includes a printed circuit board, an integrated power supply and communication connector, a SMARC connector, and an FMC connector. A power supply circuit supplies the SMARC connector and the FMC connector with power from dedicated power supply contacts of the integrated power supply and communication connector, and a communication circuit connects the SMARC connector to dedicated communication contacts of the integrated power supply and communication connector. In addition, signal lines are provided on the printed circuit board in order to connect dedicated input/output contacts of the SMARC connector to corresponding dedicated input/output contacts of the FMC connector.

16 Claims, 10 Drawing Sheets

(51) Int. Cl.
*G06F 1/18* (2006.01)
*H01R 12/71* (2011.01)

(52) U.S. Cl.
CPC ......... *H05K 1/141* (2013.01); *H01R 12/7088* (2013.01); *H01R 2201/26* (2013.01); *H05K 2201/042* (2013.01); *H05K 2201/10189* (2013.01)

(58) Field of Classification Search
CPC .... H05K 2201/10189; H05K 2201/042; G06F 1/184
See application file for complete search history.

(56) References Cited

U.S. PATENT DOCUMENTS

| | | | | |
|---|---|---|---|---|
| 8,107,256 | B1* | 1/2012 | Kondrat | H05K 7/1429 361/788 |
| 8,369,069 | B2* | 2/2013 | Osternack | H05K 7/1424 244/1 R |
| 9,219,699 | B2* | 12/2015 | Goldstein | G06F 1/181 |
| 9,300,079 | B2* | 3/2016 | Radeke | H05K 5/0026 |
| 10,624,211 | B2* | 4/2020 | Huang | H05K 1/141 |
| 2009/0195135 | A1 | 8/2009 | Nemoz et al. | |
| 2012/0203401 | A1* | 8/2012 | Dunsdon | H04B 7/18506 701/3 |
| 2014/0210258 | A1* | 7/2014 | Guering | B60R 16/03 307/9.1 |
| 2015/0244277 | A1* | 8/2015 | Wangemann | H02M 3/1582 307/9.1 |
| 2016/0229361 | A1* | 8/2016 | Osternack | G02B 6/4452 |
| 2016/0255301 | A1* | 9/2016 | Vadura | H04N 5/64 348/839 |

OTHER PUBLICATIONS

Seelam, "I/O Design Flexibility with the FPGA Mezzanine Card (FMC)," Xilinx, WP315 (v1.0), www.xilinx.com, pp. 1-8, dated Aug. 19, 2009.

SMARC, "Smart Mobility Architecture Design Guide," SGeT Standardization Group for Embedded Technologies e.V., version 1.0, pp. 1-126, dated Jul. 9, 2013.

Advantech, "ROM-DB5900: Development board for RISC SMARC v1.0 Module," pp. 1-2, dated Nov. 14, 2014.

SMARC, "Smart Mobility ARChitecture Hardware Specification, SMARC", published Jun. 2, 2016 by the Standardization Group for Embedded Technologies, SGET, version 2.0.

BSI Standards Publication, BS EN 4165-001:2015, Aerospace series—Connectors, electrical, rectangular, modular—Operating temperature 175° C. continuous, Part 001: Technical Specification (2015).

* cited by examiner

BASE MODULE AND AVIATION COMPUTER SYSTEM HAVING THE BASE MODULE

CROSS-REFERENCE TO RELATED APPLICATION

This application claims priority to German Patent Application DE 10 2016 121 598.8 filed Nov. 10, 2016, the entire disclosure of which is incorporated by reference herein.

TECHNICAL FIELD

The disclosure herein relates to a base module for use in an aviation computer system and to an aviation computer system having such a base module. Alternative uses of the base module can also relate, however, to such computer systems as are used in other motor vehicles, e.g. in cars, buses, trains and/or ships.

BACKGROUND

The conventional development of aviation computer systems is concerned with the design of aviation-specific functionalities. The aviation-specific functionalities are subsequently implemented either in hardware or software or in a combination of the two and then integrated into an existing aviation computer system. This involves a fresh design for the aviation-specific functionalities being provided for every conventional redevelopment.

In the past, it has been found that aviation-specific functionalities can increasingly be realized in software, and it is possible to resort to conventional computer hardware in the process. For the aviation computer systems, in particular, there has been recourse to subassemblies comprising processor, memory and input and output devices that have been developed as conventional computer hardware and at the same time have been able to withstand the extended burdens in aviation.

The conventional subassemblies have been permanently connected to one another throughout on a printed circuit board specific to the respective aviation computer system, in order to be able to link input and output devices as needed and at the same time to achieve a maximum weight and space saving. However, it has been found that such aviation computer systems have been able to be reused only to a limited extent, since the available resources of computation capacity and memory are limited depending on design and cannot be extended as required.

SUMMARY

It is an object of the disclosure herein to provide an aviation computer system that allows interchangeability for the different components, namely processor, memory and input and output devices, and at the same time meets aviation-specific requirements on interoperability.

According to a first aspect, a base module is proposed that is suitable for use in an aviation computer system. The base module comprises a printed circuit board, an integrated power supply and communication connector that is arranged on the printed circuit board, a SMARC (Smart Mobility ARChitecture) connector that is arranged on the printed circuit board, and an FMC (FPGA Mezzanine Card) connector that is arranged on the printed circuit board. In addition, the base module comprises a power supply circuit that is configured to supply the SMARC connector and the FMC connector with power from dedicated power supply contacts of the integrated power supply and communication connector. The base module also comprises a communication circuit that is configured to connect the SMARC connector to dedicated communication contacts of the integrated power supply and communication connector. Further, a plurality of signal lines on the printed circuit board are configured to connect dedicated input/output contacts of the SMARC connector to corresponding dedicated input/output contacts of the FMC connector.

Advantageously, the base module provides the option of using a SMARC processor module in conjunction with an FMC daughter card module. The two modules are supplied with power via the base module and can therefore be put into an operational state. Similarly, the base module uses the integrated power supply and communication connector to provide a connection to the outside that is configured according to aviation-specific requirements on interoperability. Since the SMARC processor module and the FMC daughter card module are connected to the base module via appropriate connectors, they can also be operated in different combinations with one another and interchanged independently of one another.

In one preferred embodiment of the base module according to the disclosure herein, the printed circuit board has a width in the range 90-110 mm and a length in the range 90-110 mm, and preferably has a width of 100 mm and a length of 104.307 mm.

In an advantageous refinement, these dimensions restrict the base module to a physical size that can be used in an aviation-specific housing based on the mini modular rack principle, miniMRP, (also referred to as the ARINC 836 standard) of type B and type D.

In another preferred embodiment of the base module according to the disclosure herein, the SMARC connector is arranged on the printed circuit board such that the installation of a SMARC processor module having a width of 82 mm and a depth of 50 mm is possible without jutting out over the printed circuit board, and/or the FMC connector is arranged on the printed circuit board such that the installation of an FMC daughter card module having a width of no more than 80 mm and a depth of no more than 39 mm, preferably a width of 76.5 mm and a depth of 34.5 mm, is possible without jutting out over the printed circuit board.

Advantageously, such an arrangement of the SMARC connector and the FMC connector on the base module substantially allows SMARC processor modules and FMC daughter card modules to be used that correspond to the standardized dimensions without the physical size changing.

In a further preferred embodiment of the base module according to the disclosure herein, the integrated power supply and communication connector complies with European Specification EN 4165, and/or the SMARC connector complies with version 2.0 of the Smart Mobility ARChitecture, SMARC, standard and/or the FMC connector complies with version ANSI/VITA 57.1-2008 of the FPGA Mezzanine Card, FMC, standard.

Advantageously, such recourse to industrial standards for the integrated power supply and communication connector, the SMARC connector and the FMC connector allows the interoperability of the base module and the interchangeability of the components to be improved.

In another preferred embodiment of the base module according to the disclosure herein, the power supply circuit comprises at least one DC/DC voltage transformer, and preferably the power supply circuit additionally comprises a supercapacitor or ultracapacitor, storage battery or another kind of energy store.

Advantageously, the DC/DC voltage transformer allows the base module to be powered using the aircraft's own power supply, without an additional power supply unit being required. In addition, the supercapacitor or ultracapacitor (also called Super Cap or Ultra Cap), the storage battery or the other kind of energy store ensures operability even in the event of dips in the power supply.

In a further preferred embodiment of the base module according to the disclosure herein, the power supply circuit is configured such that during initialization the SMARC connector is supplied with power first of all and only subsequently is the FMC connector supplied with power.

Advantageously, such initialization of the supply of power can be used to ensure that the SMARC processor module can control and monitor the initialization of the FMC daughter card module.

In another preferred embodiment of the base module according to the disclosure herein, the communication circuit comprises at least one transmission circuit for signal transmission according to the IEEE 802.3ab standard.

Advantageously, such use of a transmission circuit can be used to ensure the interoperability of the base module. This is because the IEEE 802.3ab standard is ordinarily used in aviation in order to network different computer systems to one another.

In a further preferred embodiment of the base module according to the disclosure herein, the dedicated input/output contacts of the SMARC connector comprise the CSI Camera Serial Interface contact pairs CSI_D0+/−, CSI_D1+/−, CSI_D2+/− and CSI_D3+/− according to the SMARC standard, and the corresponding dedicated input/output contacts of the FMC connector comprise the differential contact pairs DP4_C2M, DP5_C2M, DP9_M2C and DP8_M2C according to the FMC standard.

Advantageously, the aforementioned dedicated input/output contacts are connected to one another. It is then also possible for the Camera Serial Interface provided in the SMARC standard to be used to realize further signal transmission channels between the SMARC processor module and the FMC daughter card module.

In another preferred embodiment of the base module according to the disclosure herein, the dedicated input/output contacts of the SMARC connector comprise the GPIO (general purpose input/output) pins 0-11 according to the SMARC standard, and the corresponding dedicated input/output contacts of the FMC connector comprise the differential contact pairs LA_13, LA_17, LA_12, and LA_16 according to the FMC standard.

Advantageously, the aforementioned dedicated input/output contacts are connected to one another. It is then also possible for the General Purpose Input/Output, GPIO, contacts provided in the SMARC Standard to be used to realize further signal transmission channels between the SMARC processor module and the FMC daughter card module.

In a further preferred embodiment of the base module according to the disclosure herein, the integrated power supply and communication connector is either a plug module or a socket module having 20 contacts according to European Specification EN 4165.

Advantageously, power supply connections and the communication links can be integrated together in such an EN 4165 connector having 20 contacts.

In a further preferred embodiment of the base module according to the disclosure herein, in a plug or socket module having 20 contacts according to European Specification EN 4165, the contact pairs 1 and 6 4 and 5, 17 and 18, and 15 and 20 are the dedicated communication contacts of the integrated power supply and communication connector; the contacts 2, 3, 7, 13, 14, and 19 are the dedicated power supply contacts, to which a supply voltage is connected, of the integrated power supply and communication connector, and the contacts 8-12 and 16 are the dedicated power supply contacts, to which a ground voltage is connected, of the integrated power supply and communication connector.

Advantageously, such contact-connection of the EN 4165 connector having 20 contacts allows the individual communication links to be arranged at locations remote from one another.

In another preferred embodiment, the base module according to the disclosure herein comprises at least one mini-PCIe connector, a USB type A/B connector or an SD card connector that is configured to connect a non-volatile memory to the SMARC connector.

Advantageously, a removable memory can be used in such a base module.

According to a further aspect of the disclosure herein, an aviation computer system is disclosed. The aviation computer system comprises a base module according to one of the embodiments above, at least one SMARC processor module or an FMC daughter card module, wherein the SMARC processor module and/or the FMC daughter card module are mechanically and electrically connected to the base module via an appropriate connector.

Advantageously, the aviation computer system also provides the option of using a SMARC processor module in conjunction with an FMC daughter card module, the applicable connectors meaning that the two modules can be operated in different combinations with one another and can be interchanged independently of one another.

In one preferred embodiment, the aviation computer system, according to the disclosure herein, comprises a housing according to type B or type D of the ARINC 836 standard, wherein the integrated power supply and communication connector is accessible from an outside of the housing.

Advantageously, such a housing allows the use of the aviation computer system in a rack (e.g. in a switchgear cabinet) having multiple housing shapes matched to one another. These can be held in the rack at the shortest distance from one another according to the standard.

In another, preferred embodiment of the aviation computer system, according to the disclosure herein, the FMC daughter card module has a communication connector that is also accessible from the outside of the housing.

Advantageously, the FMC daughter card module is not restricted to communicating via the integrated power supply and communication connector. Rather, this module can also have a communication connector of its own that is accessible from the outside of the housing. This may be a connector for connecting an optical fiber, for example.

BRIEF DESCRIPTION OF THE DRAWINGS

The disclosure herein is explained in more detail below using preferred embodiments and with reference to the example figures; wherein.

DETAILED DESCRIPTION

Figure 1:
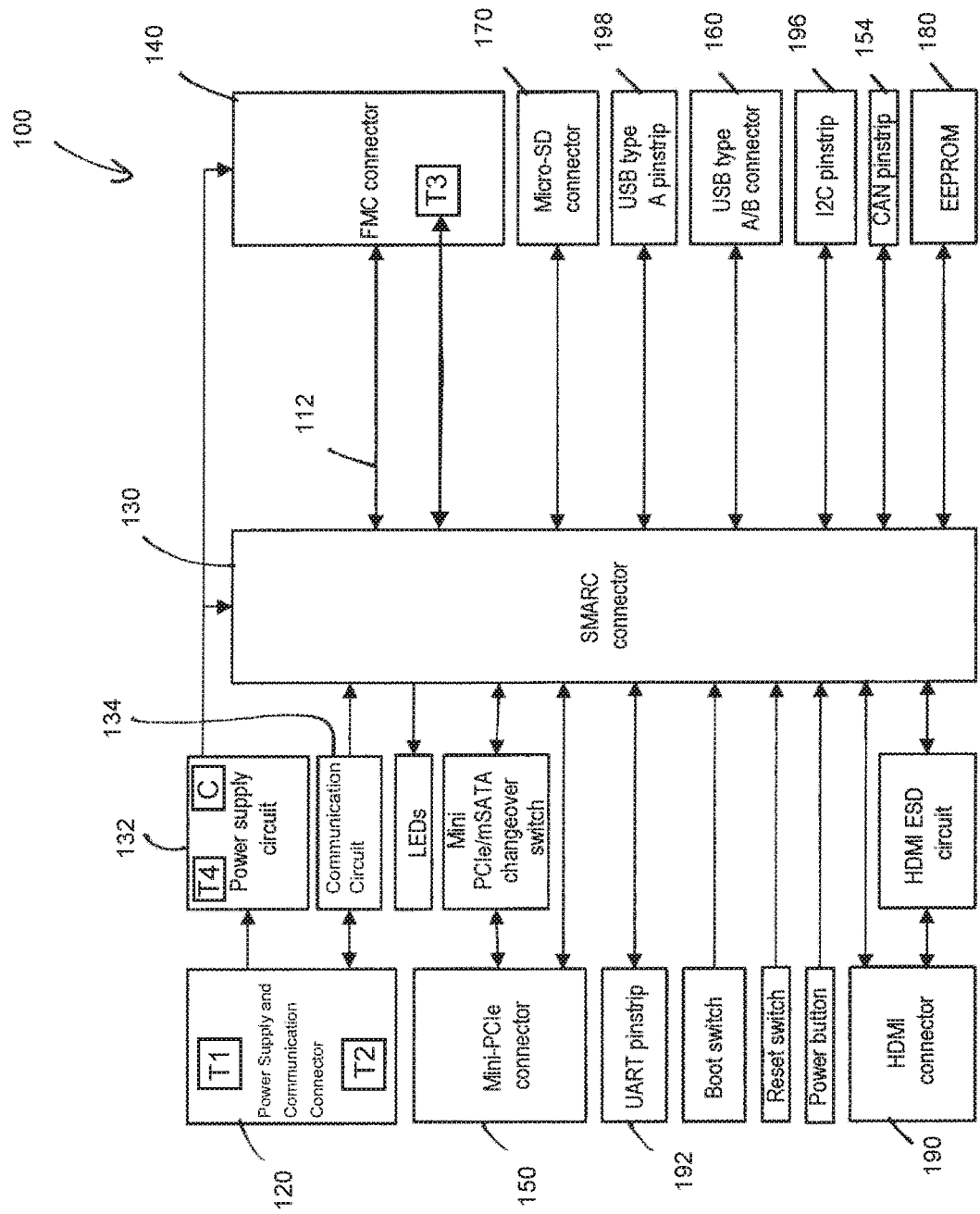
FIG. 1 is a block diagram illustrating functionality provided by a base module for use in an aviation computer system according to a first embodiment of the disclosure herein.

FIG. 1 shows a block diagram of the functionalities provided by a base module 100. In this case, the base module 100 corresponds to a first embodiment of the disclosure herein and is suitable for use in an aviation computer system. Although this depiction shows only the functionalities, the text below describes the base module 100 in full and parts of it refer to components that are not depicted.

The base module 100 comprises a printed circuit board (not shown in FIG. 1). By way of example, the printed circuit board can comprise or consist of multiple substrate layers arranged above one another and provided with copper structures. In this case, the printed circuit board is a basis for the interaction of the further components of the base module 100. In particular, the printed circuit board allows mechanical and electrical connection of the further components of the base module 100, as described further below.

For the connection to the outside, the base module 100 comprises an integrated power supply and communication connector 120 that can, for example, be a power and Ethernet connector. In this case, the connector 120 integrates both a power supply connection and a communication link for the base module 100 in a single component. Consequently, the integrated power supply and communication connector 120 is accessible from the outside, and the power supply connection and communication link for the base module 100 can be made and broken using a single plugging-in process.

In detail, the integrated power supply and communication connector 120 comprises dedicated power supply contacts that can be used to provide a supply of power for the base module 100. To this end, at least one of the dedicated power supply contacts of the power supply and communication connector 120 has a supply voltage connected to it and at least one further of the dedicated power supply contacts has a ground voltage connected to it from the outside, so that this can be used to ensure the supply of power for the base module 100.

The integrated power supply and communication connector 120 can be used to connect the base module 100 to an aircraft-internal power supply. For this purpose, the base module 100 is designed to be supplied with a supply voltage particularly in the range between 17 and 32.5 volts and with a ground voltage of 0 volts via the dedicated power supply contacts of the power supply and communication connector 120. Therefore, the power supply and communication connector 120 allows direct connection to the aircraft-internal power supply without power supply and/or power matching having previously taken place in an interposed power supply unit.

In addition, the integrated power supply and communication connector 120 comprises dedicated communication contacts that can be used to make a signal link between an external apparatus and the base module 100. To this end, one or more dedicated communication contacts have a transmission signal based on a communication standard connected to them from the outside, so that this can be used to ensure the communication with the base module 100.

The integrated power supply and communication connector 120 complies with European Specification EN 4165 and is configured either as a plug module or a socket module having 20 contacts. For such a plug or socket module, the contacts are arranged in four rows and five columns, the contact arranged at the top right in plan view being numbered 1, the contact arranged at the bottom left in plan view being numbered 20, and the contacts arranged in-between being numbered using ascending numerals row by row. In such a plug or socket module, the 20 contacts are assigned as follows:

the contact pairs 1 and 6, 4 and 5, 17 and 18, and 15 and 20 form the dedicated communication contacts of the integrated power supply and communication connector 120;

the contacts 2, 3, 7, 13, 14, and 19 form the dedicated power supply contacts of the integrated power supply and communication connector 120 that have the supply voltage connected to them during operation; and the contacts 8-12 and 16 form the dedicated power supply contacts of the integrated power supply and communication connector 120 that have the ground voltage connected to them during operation.

Advantageously, the dedicated communication contacts are thus arranged in the opposite corners of the rectangular base area of the plug or socket module. Hence, advantageous signal transmission is possible via the dedicated communication contacts based on the small dimensions of the power supply and communication connector 120.

The base module 100 additionally comprises a Smart Mobility ARChitecture (SMARC), connector 130. The SMARC connector 130 is a connector that complies with version 2.0 of the SMARC standard. In this respect, reference is made to the document "Smart Mobility ARChitecture Hardware Specification, SMARC", published on 2 Jun. 2016 by the Standardization Group for Embedded Technologies, SGET, version 2.0, the content of which is hereby incorporated into this application.

The SMARC connector 130 is a connector that allows connection to a SMARC processor module. To this end, the SMARC connector 130 comprises a mechanical receptacle, for example, that can hold a lateral section of the SMARC processor module. In addition, the SMARC connector 130 comprises some or all of the total of 314 contacts provided. According to the SMARC standard, 156 contacts (denoted by P1-P156) are provided on the top and 158 contacts are provided on the underside (denoted by P1-P158) of the lateral section of the SMARC processor module.

In particular, the SMARC standard prescribes that the contacts of the SMARC connector 130 are configured as sliding contacts that, after the SMARC processor module is plugged in, abut corresponding contact areas on the top and/or on the underside of the processor module. In this case, the sliding contacts can have a contact pressure applied to them.

The SMARC connector 130 can be used to connect a SMARC processor module to the base module 100. In particular, such a SMARC connector 130 helps the base module 100 to achieve interchangeability for a SMARC processor module connected thereto, since the standardization of the SMARC connector 130 means that every single contact has an assigned predefined interconnection that, according to the standard, can (optional) or must (absolutely necessary) be provided by any SMARC processor module. Consequently, the refinement of the base module 100 is independent of the SMARC processor module actually used and therefore always the same.

The base module 100 additionally comprises an FPGA Mezzanine Card (FMC) connector 140. The FMC connector 140 is a connector that complies with version ANSI/VISTA 57.1-2008 of the FMC standard. In this respect, reference is made to the document "American National Standard for FPGA Mezzanine Card (FMC) Standard" published in 2008 by the FMEbus International Trade Association, VITA, version ANSI/VISTA 57.1-2008, the content of which is hereby incorporated into this application.

The FMC connector 140 is a connector that allows connection to an FMC daughter card module. To this end, the FMC connector 140 comprises some or all of the total of 400 contacts provided. According to the FMC standard, contacts for the FMC connector 140 are provided in 10 rows (denoted by letters A-K) having 40 columns (denoted by numerals 1-40), this also being referred to in the standard as a "high-pin count, HPC, connector".

In particular, the FMC standard prescribes that the FMC connector 140 on the base module 100 is embodied as a socket module and the corresponding connector of the FMC daughter card module is embodied as a plug module, so that the plug module of the FMC daughter card module engages with the FMC connector 140 on the base module 100 when plugged in.

The FMC connector 140 can be used to connect an FMC daughter card module to the base module, by which mainly aviation-specific input/output functionality is provided. By way of example, one or more optical transducers having one or more optical fibers can be connected to the base module as an FMC daughter card module. In this case, the standardization of the FMC connector 140 means that interchangeability of the FMC daughter card module is ensured.

In particular, the FMC daughter card module can provide aviation-specific input/output functionality likewise according to the IEEE 802.3 "Ethernet" standard and, in this case, use either an electrical or an optical interface. By way of example, an optical interface allows a radiofrequency signal to be transmitted via an optical fiber (what is known as "Radio over fiber" or "RF over fiber"). It is also possible for the FMC daughter card module to be provided to make a connection according to the SMPTE 259M-C standard (i.e. as an SDI interface), the ISO 11898 standard (i.e. as a CAN bus interface) or another communication standard.

In addition, the base module 100 comprises a power supply circuit 132 that is configured to supply the SMARC connector 130 and the FMC connector 140 with power from the dedicated power supply contacts of the integrated power supply and communication connector 120. In other words, the power supply circuit 132 is electrically connected both to the dedicated power supply contacts of the power supply and communication connector 120 and to the SMARC connector 130 and the FMC connector 140.

For this purpose, the power supply circuit 132 comprises one or more DC/DC voltage transformers that convert the aforementioned supply voltage in the range between 17 and 32.5 volts and the ground voltage of 0 volts into one or more prescribed supply voltages for a SMARC processor module and an FMC daughter card module.

According to the SMARC standard, there is provision for the SMARC connector 130 to provide a supply voltage in a range between 3.0 and 5.25 volts referenced to a ground voltage of 0 volts. In this case, 10 different contacts are provided in the SMARC connector 130 for the supply voltage, so that a maximum current of 5 amps (0.5 amp per contact) can be delivered. Consequently, a DC/DC voltage transformation has to take place. In particular, the DC/DC voltage transformation can take place in multiple steps, e.g. first to an intermediate voltage of 12 volts and then to the supply voltage of 5 volts.

According to the FMC Standard, there is provision for the FMC daughter card module to be supplied with three different supply voltages, namely 12 volts (referred to as 12P0V), 3.3 volts (referred to as 3P3V) and with a voltage range from 0 to 3.3 volts (referred to as VADJ). The latter power supply is used for supplying power to peripheral components on the FMC daughter card module and may be prescribed differently depending on the FMC daughter card module. For the three different supply voltages, corresponding maximum currents of 1 amp (for 12P0V), 3 amps (for 3P3V) and no more than 4 amps (for VADJ) are defined.

In particular, the power supply circuit 132 is configured such that the initialization and reinitialization of the supply of power involves first the SMARC connector 130 and subsequently the FMC connector 140 being supplied with power. This has the advantage that when the base module 100 is used in an aviation computer system, the SMARC processor module is transferred to an operational state first of all and the FMC daughter card module is initialized only subsequently. Hence, the SMARC processor module itself is capable of controlling or monitoring the initialization of the FMC daughter card module. A specific initialization circuit is not required.

Such a delay in the supply of power for the FMC connector 140 in comparison with that for the SMARC connector 130 can be achieved by virtue of the two supplies of power being provided via separate DC/DC voltage transformers that are each supplied with different activation signals. By way of example, it is conceivable for the activation signal for the DC/DC voltage transformer of the FMC connector 140 to be provided by a SMARC processor module. To this end, the printed circuit board may have, by way of example, an additional signal line provided on it for an activation signal between the SMARC connector 130 and the DC/DC voltage transformer for the FMC connector 140.

Advantageously, the power supply circuit 132 can also comprise a supercapacitor or ultracapacitor labelled C in FIG. 1 that counteracts dips in the supply voltage provided via the integrated power supply and communication connector 120. In particular, there is provision for the supercapacitor or ultracapacitor (also called Super Cap or Ultra Cap) to be able to span dips in the supply voltage over a period of up to 200 milliseconds (ms) or more. This is because, specifically in the case of aircraft, such a dip in the power supply is usual when changing over between ground supply and onboard power supply.

In order to restrict the capacitance and hence the physical size and costs of the supercapacitor or ultracapacitor to a minimum, the supercapacitor or ultracapacitor is connected such that it only counteracts dips in the supply voltage of the SMARC connector 130, and has no influence on the supply of power for the FMC connector 140, for example. To that end, the supercapacitor or ultracapacitor is interposed between a DC/DC voltage transformer and the SMARC connector 130. In addition, diodes may be provided in order to decouple the DC/DC voltage transformer in the event of a dip in the power supply and thus to prevent the backflow of charge carriers into the DC/DC voltage transformer.

A restriction for the function of the supercapacitor or ultracapacitors to the supply of power for the SMARC connector 130 results from the intended use of the base module 100 in the aviation computer system. This is because dips in the supply of power can trigger undetectable or irreparable fault states both in the SMARC processor module and in the FMC daughter card module.

However, these fault states can adversely affect operability in the long term only in the case of the SMARC processor module. Even if fault states arise in the FMC daughter card module, fault handling (e.g. resetting) continues to be possible from the outside in this case by an operational SMARC processor module. This naturally likewise assumes that the SMARC processor module is operational.

In addition, the base module 100 comprises a communication circuit 134 that is configured to connect the SMARC connector 130 to the dedicated communication contacts of the integrated power supply and communication connector 120. In other words, the communication circuit 134 is electrically connected both to the dedicated communication contacts of the power supply and communication connector 120 and to the SMARC connector 130.

In particular, the communication circuit 134 comprises a transmission circuit for signal transmission according to the IEEE 802.3ab standard (also called Gigabit Ethernet over copper twisted pair cable or 1000BaseT). However, it is also conceivable for the communication circuit 134 to comprise a transmission circuit for signal transmission according to a different standard. By way of example, reference may be made to the standards IEEE 802.3bz (also called 2.5 and 5 Gigabit Ethernet or NBase-T) or IEEE 802.3an (also called 10 Gigabit Ethernet over copper twisted pair cable or 10GBase-T).

Such a transmission circuit for signal transmission according to the IEEE 802.3ab standard is used essentially for the purpose of performing potential isolation and balancing of differentially transmitted signals and may be combined in one subassembly. In this case, two respective communication contacts of the SMARC connector 130 and the integrated power supply and communication connector 120 are connected to one another via a transformer having a center tap. Hence, although signal transmission can take place between the power supply and communication connector 120 and the SMARC connector 130, transmission of power via the dedicated communication contacts is prevented at the same time.

Consequently, the dedicated communication contacts in the integrated power supply and communication connector 120 are designed solely for signal transmission and not for power transmission. For power transmission only the dedicated power supply contacts of the integrated power supply and communication connector 120 are used. Consequently, the communication circuit 134 is also not designed for energy recovery according to the IEEE 802.3af standard (also called Power-over-Ethernet).

In addition, the base module 100 comprises a plurality of signal lines 112. The signal lines 112 are formed on the printed circuit board and configured such that dedicated input/output contacts of the SMARC connector 130 are connected to dedicated input/output contacts of the FMC connector 140. In this case, the input/output contacts are respectively prescribed by the SMARC or FMC standard. When the base module 100 is used in an aviation computer system, this is intended to allow signal transmission between the SMARC processor module and the FMC daughter card module.

In particular, there is provision for the dedicated input/output contacts of the SMARC connector 130 to comprise the Camera Serial Interface, CSI, contacts CSI_D0+, CSI_D0−, and CSI_D1+, CSI_D1−, and CSI_D2+, CSI_D2−, and CSI_D3+, CSI_D3− (also referred to as contact pairs CSI_D0+/−, CSI_D1+/−, CSI_D2+/− and CSI_D3+/−) according to the SMARC standard. The corresponding dedicated input/output contacts of the FMC connector 140 comprise the differential contacts DP4_C2M_P, DP4_C2M_N, and DP5_C2M_P, DP5_C2M_N, and DP9_M2C_P, and DP9_M2C_N, and DP8_M2C_P, DP8_M2C_N (also referred to as contact pairs DP4_C2M, DP5_C2M, DP9_M2C, and DP8_M2C) according to the FMC standard. In this case, these dedicated input/output contacts of the SMARC connector 130 are immediately (i.e. directly) electrically connected to those of the FMC connector 140 in accordance with a 1:1 association.

Advantageously, the differential contact pairs DP4_C2M, DP5_C2M, DP9_M2C and DP8_M2C according to the FMC standard are input/output contacts that are provided for differential signal transmission and are specified as a multi-Gigabit interface. In the configuration above, data transmission rates of up to 12.5 Gigabits per second (12.5 Gbps for short) are possible.

In addition, there is provision for the dedicated input/output contacts of the SMARC connector 130 to comprise the GPIO pins 0-11 according to the SMARC standard, and for the corresponding dedicated input/output contacts of the FMC connector to comprise the differential contacts LA_13_P, LA_13_N, and LA_17_P, LA_17_N, and LA_12_P, LA_12_N, and LA_16_P, LA_16_N (also referred to as contact pairs LA_13, LA_17, LA_12, and LA_16) according to the FMC standard. In this case too, the dedicated input/output contacts of the SMARC connector 130 are immediately (i.e. directly) electrically connected to those of the FMC connector 140 in accordance with a 1:1 association.

Advantageously, the differential contact pairs LA_13, LA_17, LA_12 and LA_16 according to the FMC standard are input/output contacts that can be used for a user-specific interface and, in the configuration above, allow data transmission rates of up to 12.5 Gigabits per second (12.5 Gbps for short).

Further dedicated input/output contacts of the SMARC connector 130 comprise the USB2_SSRX/TX link, the USB3_SSRX/TX link, PCI Express link B for TX and RX and the PCI Express link C just for TX, according to the SMARC standard. The corresponding dedicated input/output contacts of the FMC connector 140 comprise the contact pairs DP1_M2C, DP2_M2C, DP3_M2C, DP4_M2C, DP5_M2C, DP1_C2M, DP2_C2M, DP3_C2M, DP5_C2M according to the FMC standard. In this case, these dedicated input/output contacts of the SMARC connector 130 are immediately (i.e. directly) electrically connected to those of the FMC connector 140 in accordance with a 1:1 association.

In addition, the base module 100 comprises at least one mini PCIe connector 150, a USB type A/B connector 160 or an SD (or micro SD) card connector 170 that is configured to connect a nonvolatile memory to the SMARC connector 130. It may be advantageous for the SMARC processor module to have an associated nonvolatile memory (i.e. read-only memory) when the base module 100 is used in an aviation computer system. The memory can store operating programs or configurations and control information for the SMARC processor module. In addition, user data may also be stored in the SMARC processor module. Independent of its actual use, at least one of the aforementioned connection devices is used to provide the possibility of flexibly extending the SMARC processor module.

Alternatively or additionally, the base module 100 comprises what is known as an electronically erasable programmable read-only memory (EEPROM) 180, which is connected to the SMARC connector 130 via the I2C bus. The memory can likewise store operating programs or configurations and control information.

In addition, the base module 100 comprises an HDMI connector 190, a UART pinstrip 192, a CAN pinstrip 194, an I2C bus pinstrip 196 and/or a further USB type A pinstrip or connector 198. All of these connections on the base module 100 are optional components that are provided solely for programming, but not for normal operation.

Figure 2:
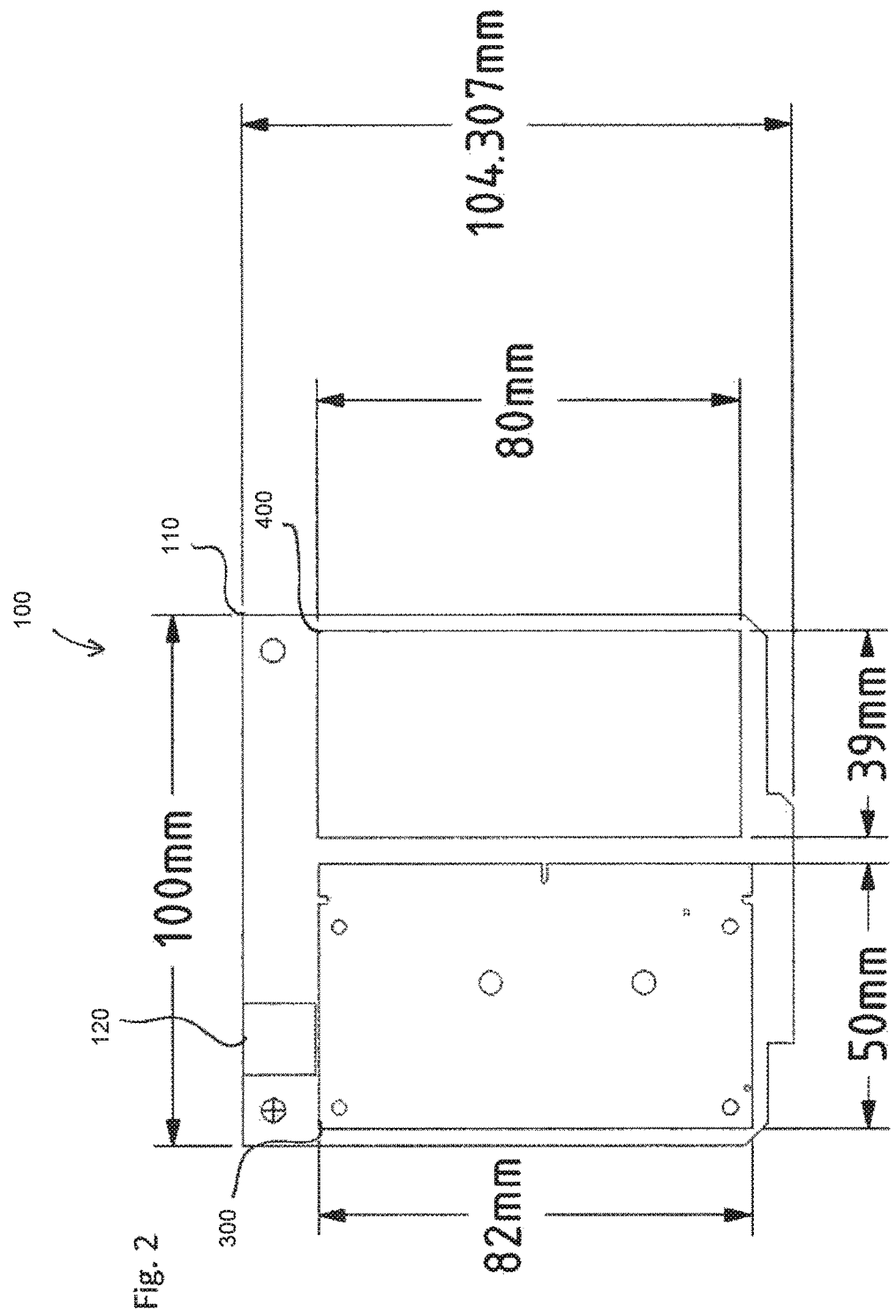
FIG. 2 shows the dimensions of the base module for use in an aviation computer system according to the first embodiment of the disclosure herein shown in FIG. 1.

The description below refers to FIG. 2, which shows example dimensions of the base module generally designated 100 according to the first embodiment shown in FIG. 1. The dimensions described in detail make the base module 100 suitable for use in an aviation computer system. This is because, particularly for aviation, it is necessary for the dimensions to be chosen to be as compact as possible in order to avoid unnecessary space requirement and weight.

The base module 100 is shown with its components, the printed circuit board 110 and the integrated power supply and communication connector 120. For reasons of clarity, the SMARC connector 130 and the FMC connector 140 have not been depicted. In this context, however, it is highlighted that both the SMARC connector 130 and the FMC connector 140 are a part of the base module 100 according to the first embodiment.

Rather, this view shows the dimensions of a SMARC processor module 300 provided for connection to the SMARC connector 130 and of an FMC daughter card module 400 provided for connection to the FMC connector 140. This is merely a depiction that is meant to facilitate the comprehensibility of the base module 100 in an aviation computer system.

In particular, it can be gathered from the view that the printed circuit board 110 of the base module 100 has a width in the range 90-110 mm and a length in the range 90-110 mm, and preferably a width of 100 mm and a length of 104.307 mm.

In addition, the SMARC connector 130 can be arranged on the printed circuit board 110 such that the installation of a SMARC processor module 300 having a width of 82 mm and a depth of 50 mm is possible without jutting out over the lateral edge of the printed circuit board 110. Moreover, the FMC connector 140 is arranged on the printed circuit board 110 such that the installation of an FMC daughter card module 400 having a width of no more than 80 mm and a depth of no more than 39 mm, preferably a width of 76.5 mm and a depth of 34.5 mm, is possible without jutting out over the lateral edge of the printed circuit board 110.

Such an installation of the SMARC processor module 300 and of the FMC daughter card module 400 is additionally possible without colliding with the integrated power supply and communication connector 120 electrically and mechanically connected to the printed circuit board 110.

Figure 3:
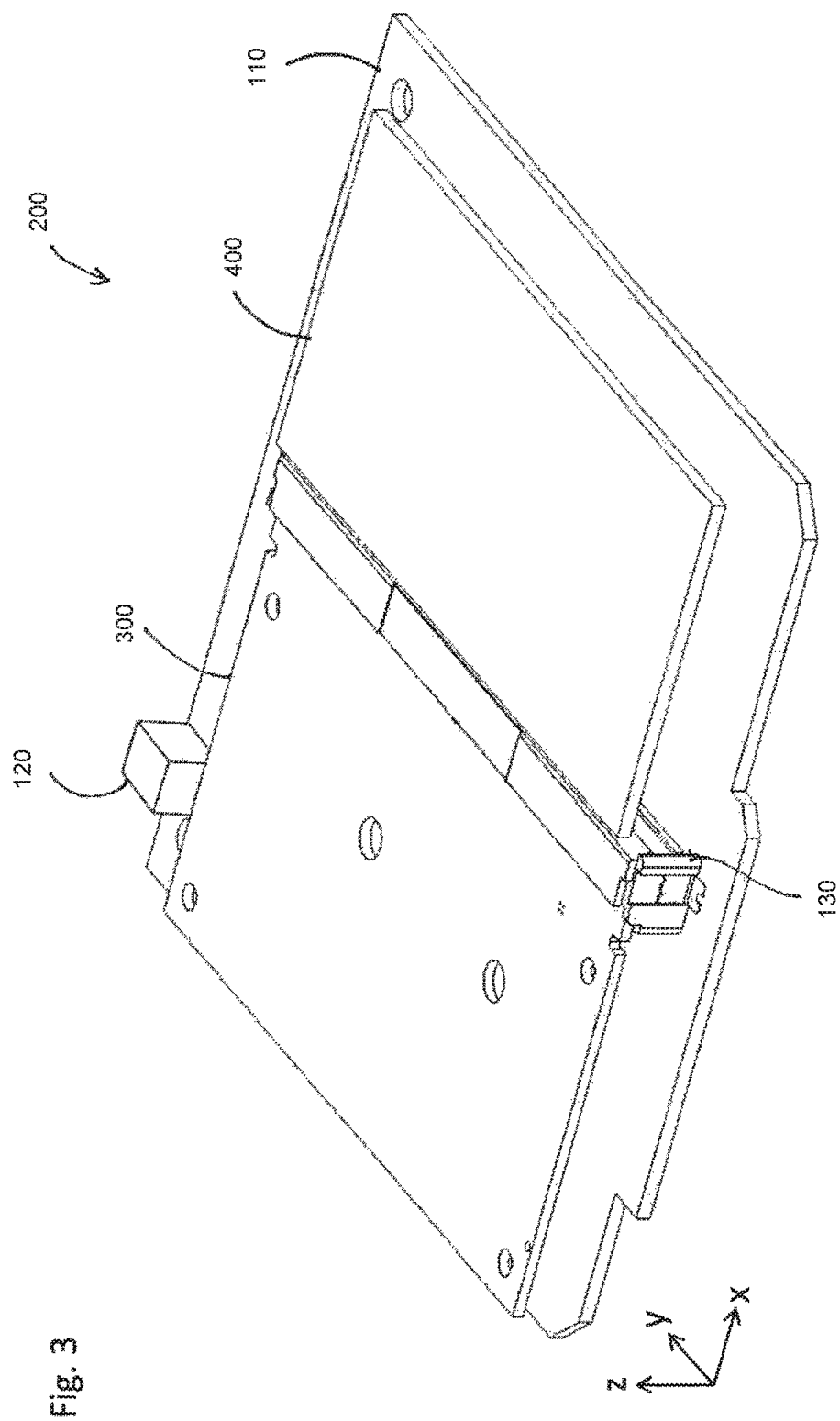
FIG. 3 is a schematic perspective view of an aviation computer system according to a second embodiment of the disclosure herein, in which a base module is used.
Figure 4:
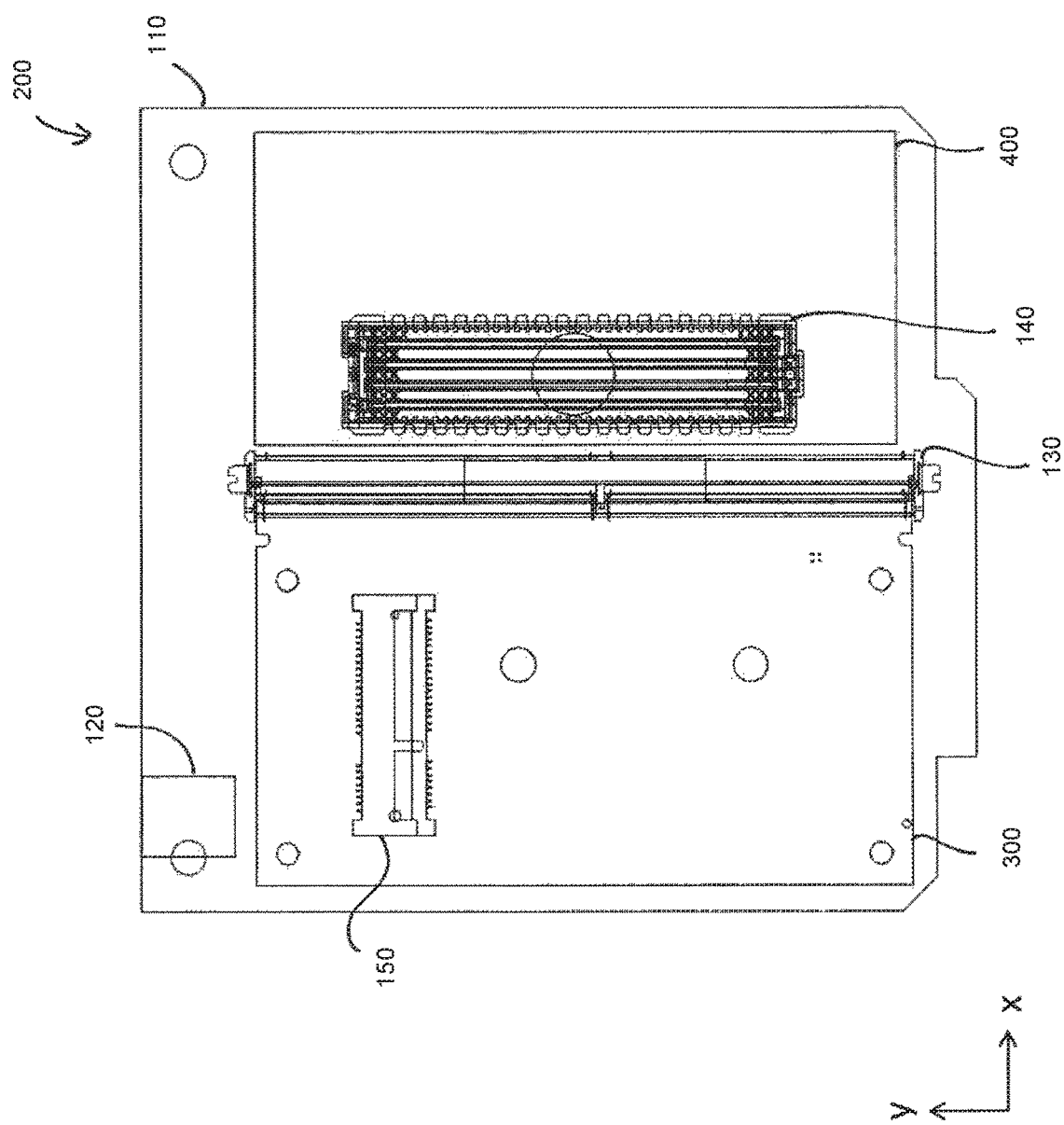
FIG. 4 is a schematic plan view of the aviation computer system, depicted using transparent contours, according to the second embodiment of the disclosure herein from FIG. 3, in which a base module is used.
Figure 5:
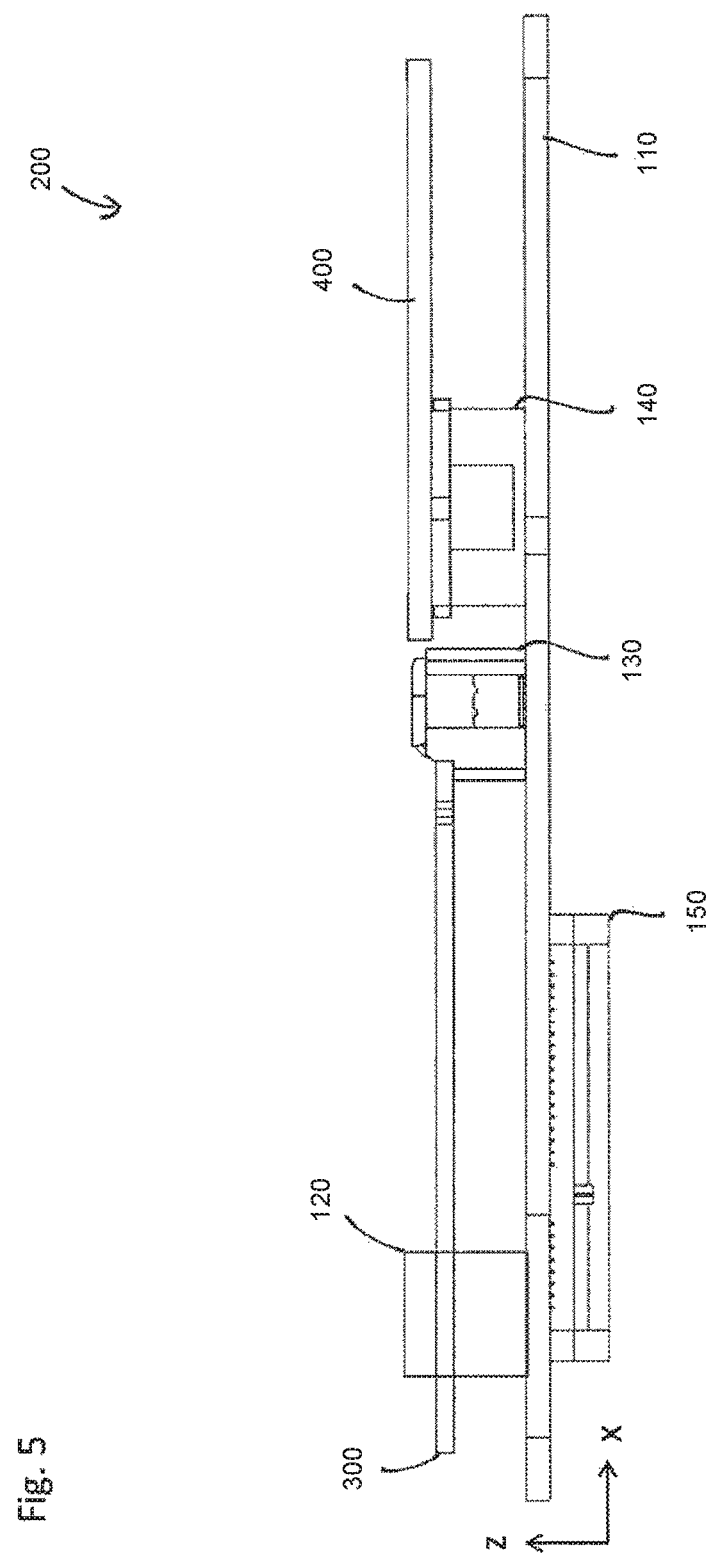
FIG. 5 is a schematic side view of the aviation computer system according to the second embodiment of the disclosure herein from FIGS. 3 and 4, in which a base module is used.

FIGS. 3-5 show an aviation computer system generally designated 200 according to a second embodiment of the disclosure herein. In this case, the aviation computer system 200 is shown in a schematic perspective view in FIG. 3, in a schematic plan view with transparent contours in FIG. 4, and in a schematic side view in FIG. 5.

The aviation computer system 200 comprises a base module having a printed circuit board 110, an integrated power supply and communication connector 120, a SMARC connector 130 and an FMC connector 140. In this case, the base module of the depicted aviation computer system 200 corresponds to the base module of the first embodiment, which means that in this context reference is made only to the explanations above.

In addition, the aviation computer system 200 comprises a SMARC processor module 300 that is mechanically and electrically connected to the SMARC connector 130. To that end, the top of the printed circuit board 110 has the SMARC connector 130 arranged on it. This SMARC connector 130 mechanically holds a lateral section of the SMARC processor module 300. This lateral section also has contact areas of the SMARC processor module 300 arranged in it that, in the held state, make an electrical connection with the contacts of the SMARC connector 130. The SMARC processor module 300 extends from the SMARC connector 130 in a lateral (or longitudinal) direction (i.e. in the negative direction of the X axis).

The aviation computer system 200 also comprises an FMC daughter card module 400 that is mechanically and electrically connected to the FMC connector 140. To that end, the top of the printed circuit board 110 has the FMC connector 140 arranged on it, which is embodied as a socket module. This FMC connector 140 has had a plug module, which is embodied on the FMC daughter card module 400, plugged into it, by which the mechanical and electrical connection is made. The plug module is provided on the underside of the FMC daughter card module 400. In addition, the FMC daughter card module extends substantially in a lateral (or longitudinal) direction opposite to that of the SMARC processor module 300 (i.e. in a positive direction of the X axis).

In addition, in the connected state, the SMARC processor module 300 and the FMC daughter card module 400 are arranged substantially parallel to the printed circuit board 110.

The figures likewise show the mini-PCIe connector 150, which is arranged on the underside of the printed circuit board 110. This mini-PCIe connector 150 allows the connection to a nonvolatile memory.

Figure 6:
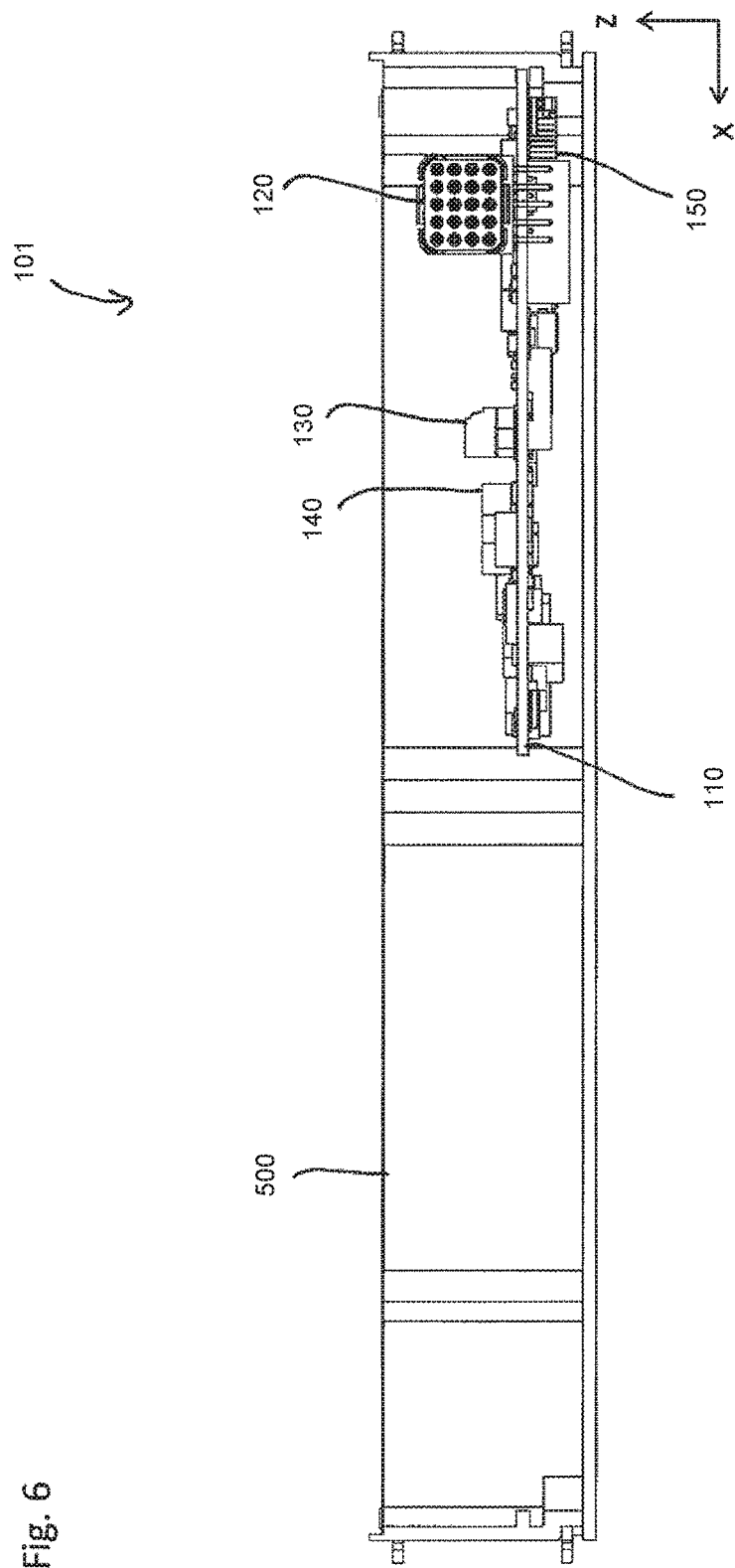
FIG. 6 is a schematic side view of a base module for use in an aviation computer system according to a third embodiment of the disclosure herein.
Figure 7:
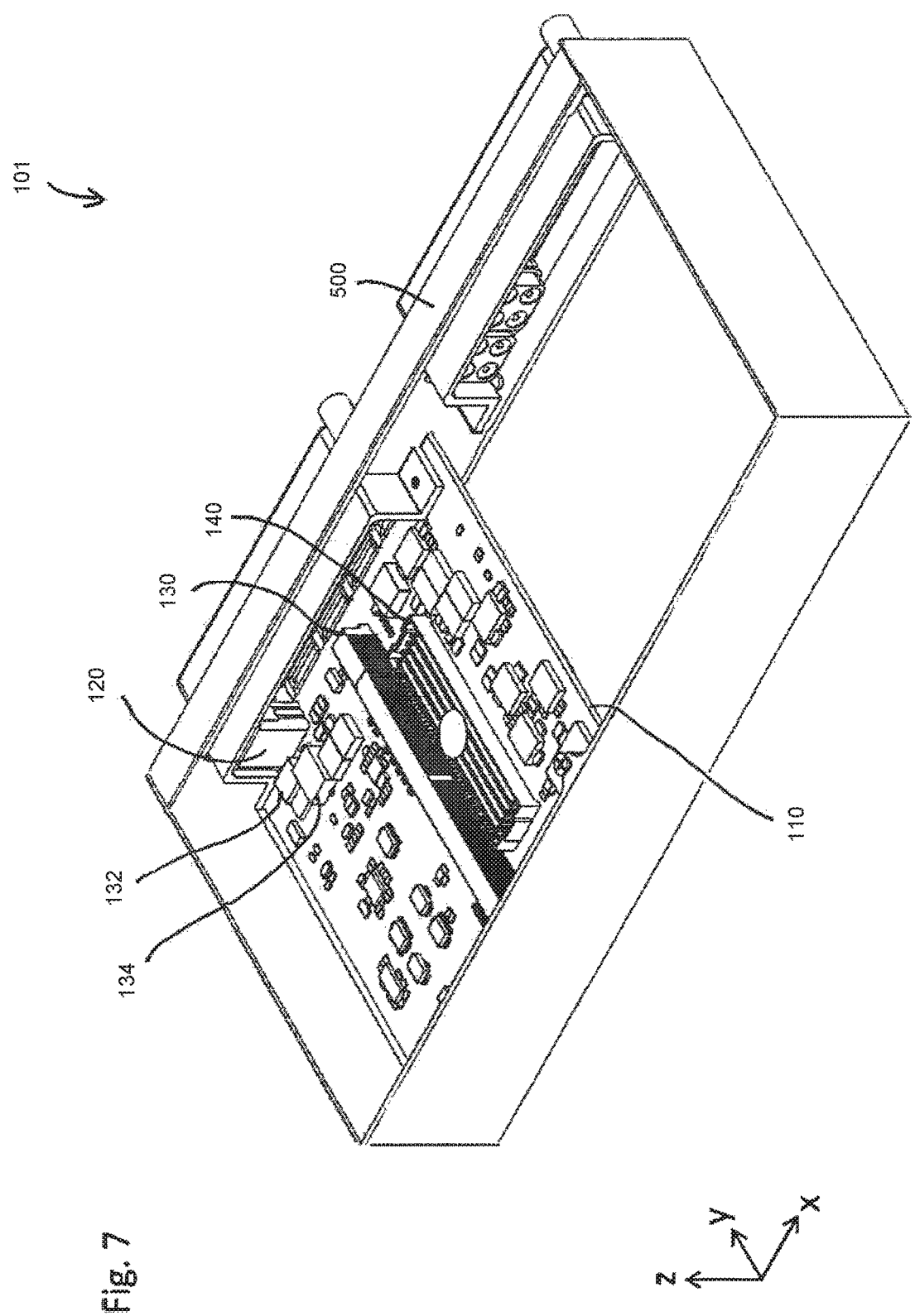
FIG. 7 is a schematic perspective view of the base module for use in an aviation computer system according to the third embodiment of the disclosure herein shown in FIG. 6.

FIGS. 6 and 7 show a schematic side view and a schematic perspective view of a base module 101 according to a third embodiment. This base module 101 is a modification of the base module 100 according to the first embodiment.

For this, the base module 101 comprises substantially the same components, namely the printed circuit board 110, the integrated power supply and communication connector 120, the SMARC connector 130, the FMC connector 140 and the mini-PCIe connector 150, which means that reference is made only to the explanations above for this.

Similarly, the base module 101 comprises the power supply circuit 132 and the communication circuit 134, reference likewise being made to the explanations above for this. Further circuits are also shown in the depiction of the base module 101, these supporting the use of the base module 101 in an aviation computer system.

One difference in this embodiment is that the base module 101 is arranged in a housing 500 according to type D of the ARINC 836 standard. In this case, the housing 500 completely surrounds the base module 101, only the integrated power supply and communication connector 120 being accessible from outside of the housing 500 in this case.

In this case, the height of the base module 101 (i.e. along the Z axis) takes up a substantial part of the height of the housing 500, but extends along its lateral (or longitudinal) direction (i.e. along the X axis) only up to half the width of the housing 500. Accordingly, it is evident to a person skilled in the art that the base module 101 could also be arranged in a housing of type B of the ARINC 836 standard.

This is because the ARINC 836 standard specifies these two types B and D such that the housing shapes have matching dimensions; in particular, a housing of type B has the same height in relation to type D, the same depth but only half the width. A housing according to type B has a height of 32.8 mm and a width of 105.04 mm and a housing according to type D has a height of likewise 32.8 mm and a width of 217 mm.

In particular, a lateral view is chosen in FIG. 6, which shows a mating surface of the integrated power supply and communication connector 120. The power supply and communication connector 120 complies with European Specification EN 4165 and is configured as a socket module having 20 contacts that are accessible from the outside of the housing 500. In such a socket module, the contacts are arranged in 4 rows and 5 columns, the contact arranged at the top right in a plan view being numbered 1, the contact arranged at the bottom left in the plan view being numbered 20 and the contacts arranged in-between being numbered using ascending numerals row by row.

Figure 8:
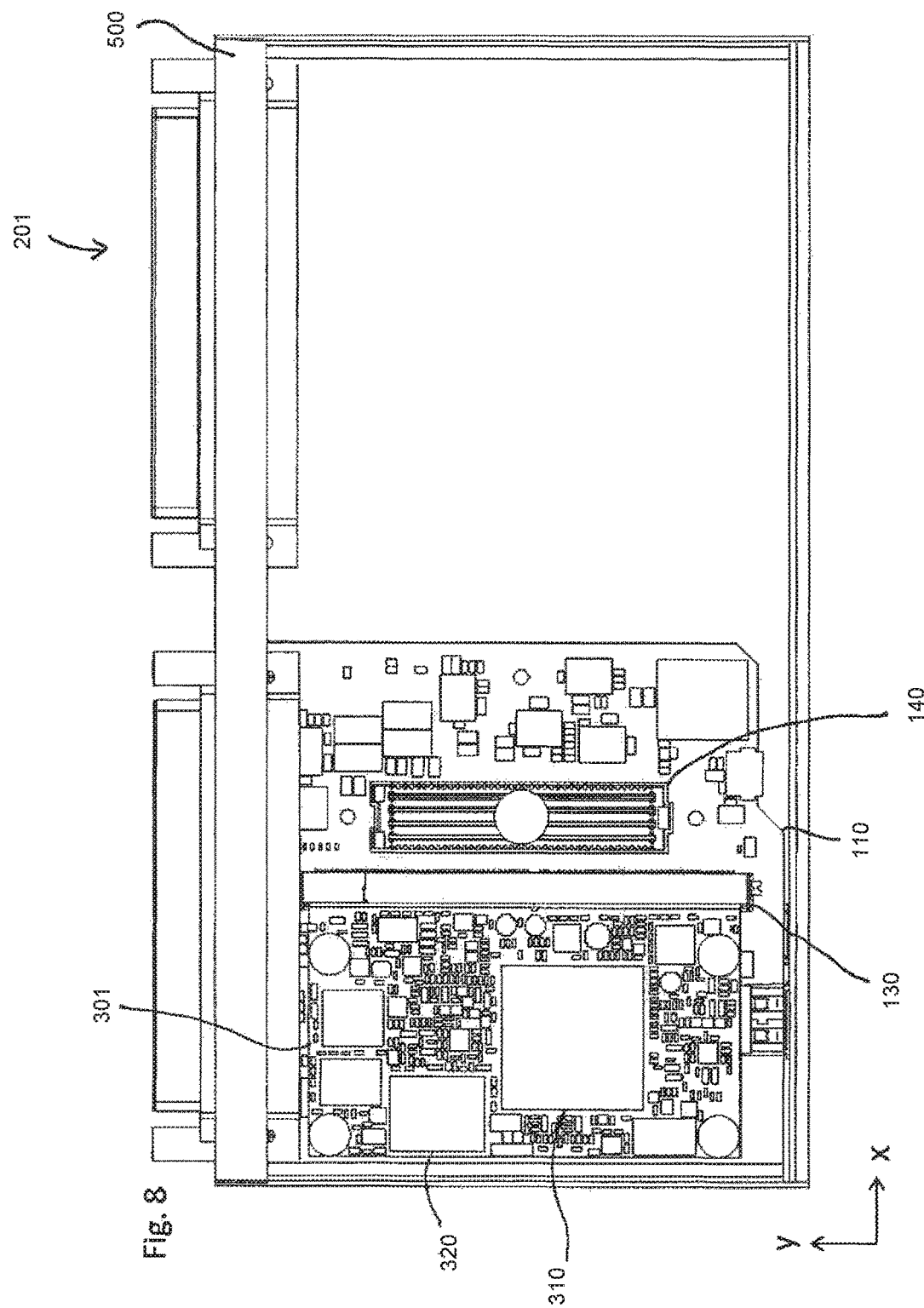
FIG. 8 is a schematic plan view of an aviation computer system according to a fourth embodiment of the disclosure herein, in which a base module is used.

FIG. 8 shows a schematic perspective view of an aviation computer system 201 according to a fourth embodiment. The aviation computer system 201 is a modification of the aviation computer system 200 according to the second embodiment. Accordingly, the aviation computer system 201 likewise comprises a base module 101 having the printed circuit board 110, the integrated power supply and communication connector 120 (not shown in FIG. 8), the SMARC connector 130 and the FMC connector 140, which means that reference is made only to the explanations above for this.

Just one difference in this aviation computer system 201 is that although it comprises a SMARC processor module 301, it does not comprise an FMC daughter card module 400. Therefore, an aviation computer system 201 is shown that dispenses with the use of an FMC daughter card module 400 and with the aviation-specific input/output functionality realized by that means.

Specifically from this embodiment, it becomes clear that the aviation computer system 201 does not always have to comprise or consist of a base module 101 together with a SMARC processor module and an FMC daughter card module, but rather may alternatively also include only either a SMARC processor module or an FMC daughter card module. It is therefore possible for these two modules to be operated with one another in different combinations too and to be replaced independently of one another.

In particular, this portrayal shows a SMARC processor module 201 that is connected to the SMARC connector 130 of the base module 101 and comprises a processor 310 and a main memory 320. Thus, the SMARC processor module 301 has the capabilities to use the integrated power supply and communication connector 120 of the base module 101 to communicate with externally connected further aviation computer systems. Such an aviation computer system 201 allows exemplary use as a computer server.

In addition, the aviation computer system 201 comprises a housing 500 according to type D of the ARINC 836 standard in which the base module and the SMARC processor module 301 are arranged. The integrated power supply and communication connector 110 is accessible from an outside of the housing 500 in this case.

Figure 9:
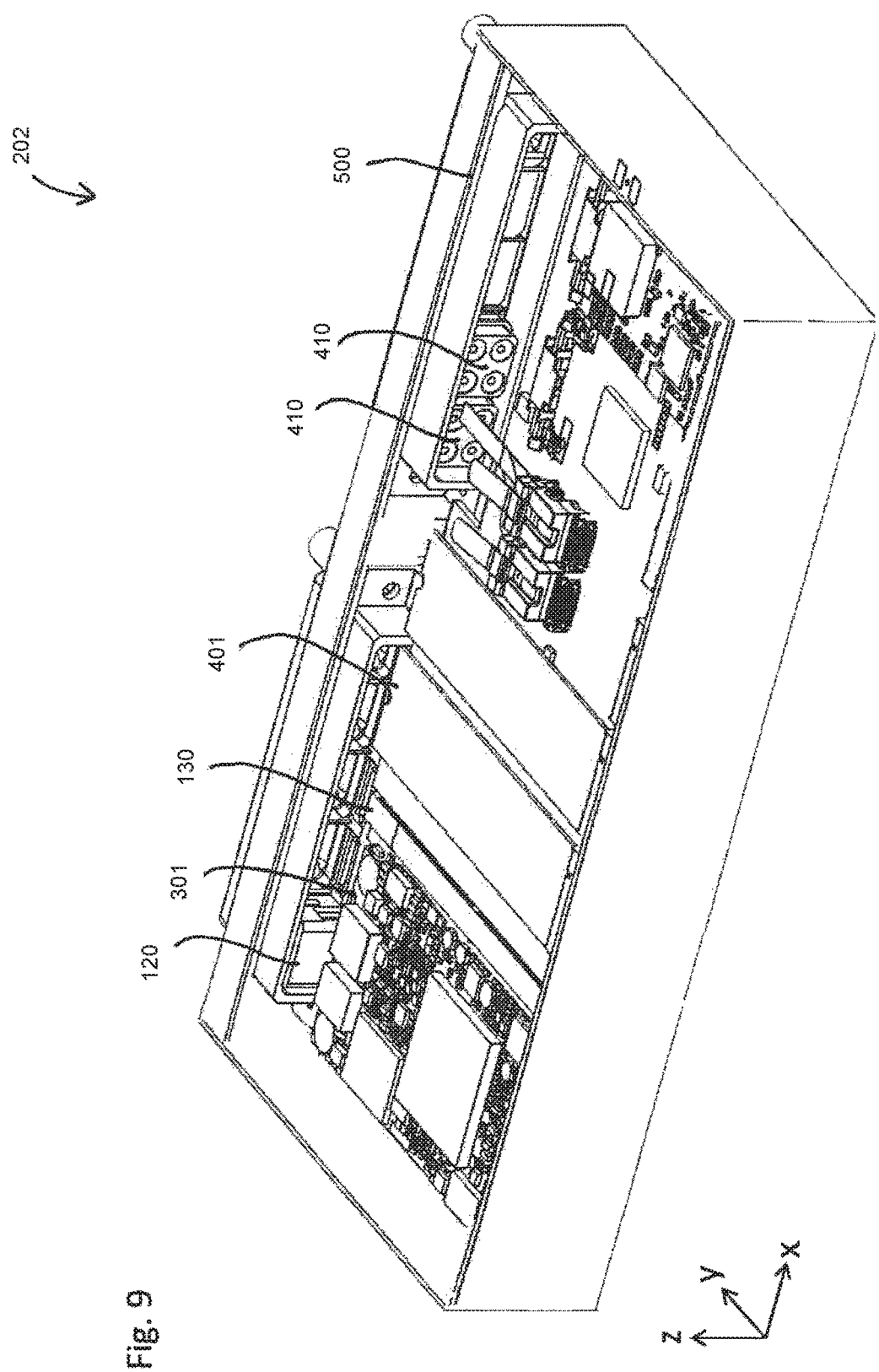
FIG. 9 is a schematic perspective view of an aviation computer system according to a fifth embodiment of the disclosure herein, in which a base module is used.
Figure 10:
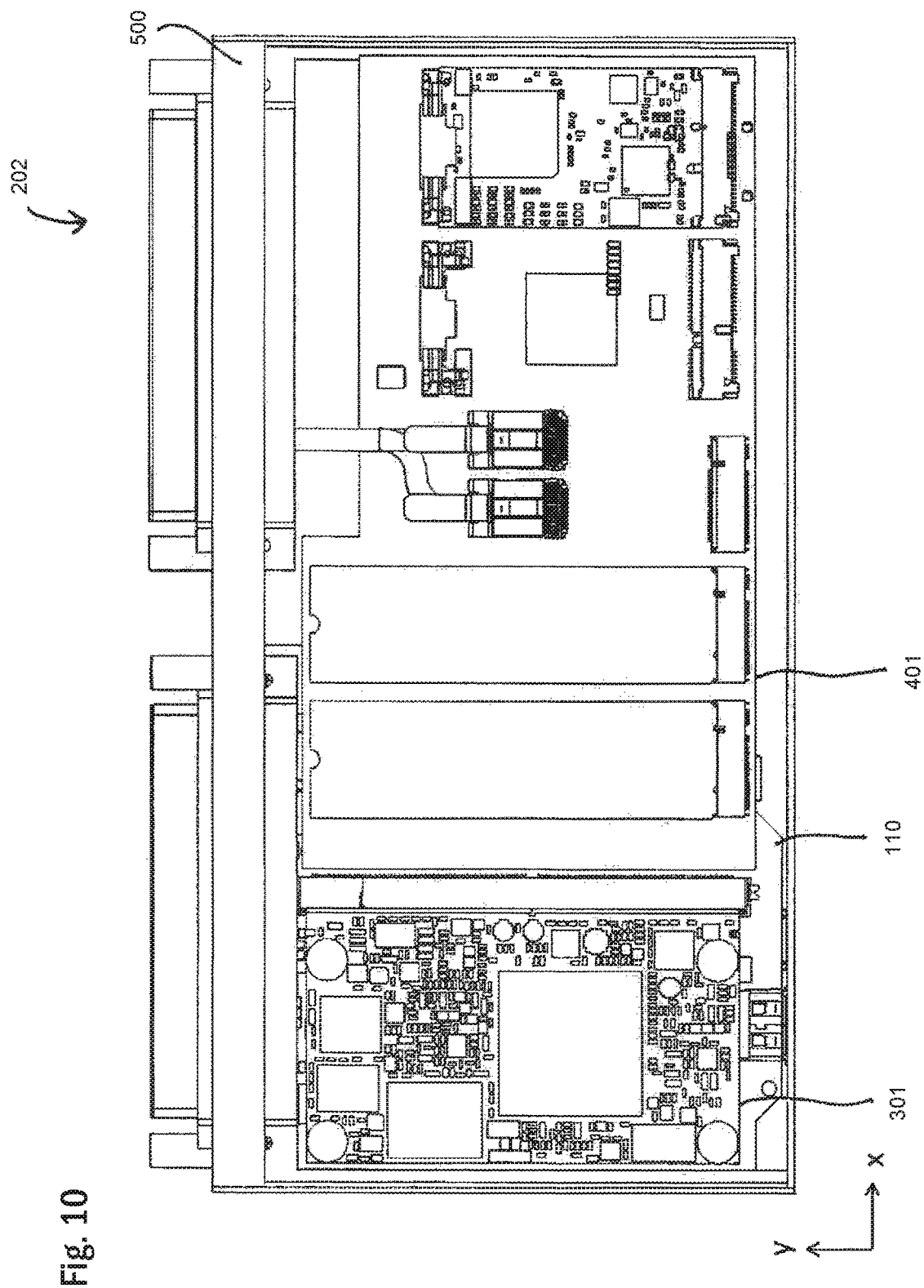
FIG. 10 is a schematic plan view of an aviation computer system according to the fifth embodiment of the disclosure herein from FIG. 9, in which a base module is used.

FIGS. 9 and 10 show a schematic perspective view and a plan view of an aviation computer system 202 according to a fifth embodiment. This aviation computer system 202 is a modification of the aviation computer system 201 according to the second embodiment. Accordingly, the aviation computer system 202 likewise comprises a base module 101 having the printed circuit board 110, the integrated power supply and communication connector (not shown), the SMARC connector 130 and the FMC connector 140, which means that reference is made only to the explanations above for this.

The aviation computer system 202 also comprises a SMARC processor module 301 that is connected to the SMARC connector 130 of the base module. In addition, the aviation computer system 202 comprises an FMC daughter card module 401, which means that this can be used to realize aviation-specific input/output functionality.

In this context, the FMC daughter card module 401 is not restricted to dimensions that allow installation without jutting over the printed circuit board 110 of the base module 101. Rather, although the FMC daughter card module 401 has the same width of more than 80 mm, it has a length of no more than 140 mm, which means that the FMC daughter card module 401 only allows installation with lateral jutting over the printed circuit board 110 of the base module 101.

In addition, the aviation computer system 202 comprises a housing 500 according to type D of the ARINC 836 standard in which the base module, the SMARC processor module 301 and the FMC daughter card module 401 are arranged. In this case, the integrated power supply and communication connector 120 is accessible from an outside of the housing 500.

The FMC daughter card module 401 extends inside the housing 500 along its lateral (or longitudinal) direction (i.e. along the X axis) over the entire width of the housing 500. Therefore, the volume and hence the space provided in the housing 500 is utilized in optimum fashion without having to resort to a larger housing shape for the housing, specified according to the ARINC 836 standards.

In addition, the FMC daughter card module 401 has a communication connector 410 that is also accessible from the outside of the housing 500. The communication connector 410 is likewise configured according to European Specification EN 4165 and has electrical and/or optical contacts, so that these can be used to realize the aviation-specific input/output functionality.

In the present case, the communication connector 410 of the FMC daughter card module 401 has optical contacts that may be configured as single-fiber or multi-fiber contacts (e.g. as an MT connector according to IEC standard 61754-5).

The subject matter disclosed herein can be implemented in software in combination with hardware and/or firmware. For example, the subject matter described herein can be implemented in software executed by a processor or processing unit. In one exemplary implementation, the subject matter described herein can be implemented using a computer readable medium having stored thereon computer executable instructions that when executed by a processor of a computer control the computer to perform steps. Exemplary computer readable mediums suitable for implementing the subject matter described herein include non-transitory devices, such as disk memory devices, chip memory devices, programmable logic devices, and application specific integrated circuits. In addition, a computer readable medium that implements the subject matter described herein can be located on a single device or computing platform or can be distributed across multiple devices or computing platforms.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a", "an" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

REFERENCE NUMERALS 100, 101 Base module
110 Printed circuit board
112 Signal lines
120 Power supply and communication connector
130 SMARC connector
132 Power supply circuit
134 Communication circuit
140 FMC connector
150 mini-PCIe connector
160 USB type A/B connector
170 SD card connector
180 EEPROM
190 HDMI connector
192 UART pinstrip
194 CAN pinstrip
196 I2C bus pinstrip
198 USB connector
200, 201, 202 Aviation computer system
300, 301 SMARC processor module
310 Processor
320 Main memory
400, 401 FMC daughter card module
500 Housing
T1 Transformer
T2 Transformer
T3 Transformer

The invention claimed is:

1. A base module for use in an aviation computer system, comprising:
a printed circuit board;
an integrated power supply and communication connector on the printed circuit board;
a SMARC connector on the printed circuit board; and
an FMC connector on the printed circuit board;
wherein
a power supply circuit on the printed circuit board is configured to supply the SMARC connector and the FMC connector with power from dedicated power supply contacts of the integrated power supply and communication connector;
a communication circuit on the printed circuit board is configured to connect the SMARC connector to dedicated communication contacts of the integrated power supply and communication connector; and
a plurality of signal lines on the printed circuit board are configured to connect dedicated input/output contacts of the SMARC connector to corresponding dedicated input/output contacts of the FMC connector; and
wherein the power supply circuit comprises at least one DC/DC voltage transformer and either a supercapacitor or ultracapacitor.

2. The base module according to claim 1, wherein:
the printed circuit board has a width of 90-110 mm and a length of 90-110 mm.

3. The base module according to claim 2, wherein:
the printed circuit board has a width of 100 mm and a length of 104.307 mm.

4. The base module according to claim 2, wherein:
the SMARC connector is arranged on the printed circuit board such that installation of a SMARC processor module having a width of 82 mm and a depth of 50 mm is possible without jutting out over the printed circuit board; or
the FMC connector is arranged on the printed circuit board such that installation of an FMC daughter card module having a width of no more than 80 mm and a depth of no more than 39 mm is possible without jutting out over the printed circuit board.

5. The base module according to claim 1, wherein:
the SMARC connector is arranged on the printed circuit board such that installation of a SMARC processor module having a width of 82 mm and a depth of 50 mm is possible without jutting out over the printed circuit board; or
the FMC connector is arranged on the printed circuit board such that installation of an FMC daughter card module having a width of no more than 80 mm and a depth of no more than 39 mm is possible without jutting out over the printed circuit board.

6. The base module according to claim 1, wherein:
the integrated power supply and communication connector are in compliance with European Specification EN 4165; or
the SMARC connector is in compliance with version 2.0 of the Smart Mobility ARChitecture, SMARC, standard; or
the FMC connector is in compliance with version ANSI/VITA 57.1-2008 of the FPGA Mezzanine Card, FMC, standard.

7. The base module according to claim 1, wherein:
the power supply circuit is configured such that during initialization the SMARC connector is supplied with power first of all and only subsequently is the FMC connector supplied with power.

8. The base module according to claim 1, wherein:
the communication circuit comprises at least one transmission circuit for signal transmission according to IEEE 802.3ab standard.

9. The base module according to claim 1, wherein:
the dedicated input/output contacts of the SMARC connector comprise CSI Camera Serial Interface contact pairs CSI_D0+/−, CSI_D1+/−, CSI_D2+/− and CSI_D3+/− according to SMARC standard; and
the corresponding dedicated input/output contacts of the FMC connector comprise differential contact pairs DP4_C2M, DP5_C2M, DP9_M2C and DP8_M2C according to FMC standard.

10. The base module according to claim 1, wherein:
the dedicated input/output contacts of the SMARC connector comprise GPIO pins 0-11 according to SMARC standard; and
the corresponding dedicated input/output contacts of the FMC connector comprise differential contact pairs LA_13, LA_17, LA_12, and LA_16 according to FMC standard.

11. The base module according to claim 1, wherein:
the integrated power supply and communication connector is either a plug module or a socket module having 20 contacts according to European Specification EN 4165.

12. The base module according to claim 11, wherein, in the plug or socket module having 20 contacts according to European Specification EN 4165,
contact pairs 1 and 6, 4 and 5, 17 and 18, and 15 and 20 are dedicated communication contacts of the integrated power supply and communication connector;
contacts 2, 3, 7, 13, 14, and 19 are dedicated power supply contacts, to which a supply voltage is connected, of the integrated power supply and communication connector; and
contacts 8-12 and 16 are dedicated power supply contacts, to which a ground voltage is connected, of the integrated power supply and communication connector.

13. The base module according to claim 1, additionally comprising:
at least one mini-PCIe connector, a USB type A/B connector or an SD card connector that is configured to connect a non-volatile memory to the SMARC connector.

14. An aviation computer system, comprising:
a base module according to claim 1;
at least one SMARC processor module or an FMC daughter card module, wherein the SMARC processor module or the FMC daughter card module are mechanically and electrically connected to the base module via a connector.

15. The aviation computer system according to claim 14, further comprising:
a housing according to type B or type D of the ARINC 836 standard;
wherein the integrated power supply and communication connector is accessible from an outside of the housing.

16. The aviation computer system according to claim 15, wherein the FMC daughter card module has a communication connector that is also accessible from outside of the housing.

* * * * *